United States Patent [19]

Yatsuo et al.

[11] 4,443,810
[45] Apr. 17, 1984

[54] GATE TURN-OFF AMPLIFIED THYRISTOR WITH NON-SHORTED AUXILIARY ANODE

[75] Inventors: Tsutomu Yatsuo; Takahiro Nagano, both of Hitachi, Japan

[73] Assignee: Hitachi, Ltd., Tokyo, Japan

[21] Appl. No.: 320,536

[22] Filed: Nov. 12, 1981

Related U.S. Application Data

[63] Continuation of Ser. No. 112,811, Jan. 17, 1980, abandoned.

[30] Foreign Application Priority Data

Jan. 24, 1979 [JP] Japan .................................. 54-6067

[51] Int. Cl.³ ............................................ H01L 29/74
[52] U.S. Cl. ....................................... 357/38; 357/86; 307/252 A; 307/252 C

[58] Field of Search ............... 357/38, 86; 307/252 A, 307/252 C

[56] References Cited

FOREIGN PATENT DOCUMENTS

| | | | |
|---|---|---|---|
| 2431022 | 1/1975 | Fed. Rep. of Germany | 357/38 |
| 52-52377 | 4/1977 | Japan | 357/38 |
| 55-98858 | 7/1980 | Japan | 357/38 |

Primary Examiner—Joseph E. Clawson, Jr.
Attorney, Agent, or Firm—Antonelli, Terry & Wands

[57] ABSTRACT

A gate turn-off thyristor is disclosed which includes a main thyristor having a shorted emitter structure on the anode side thereof and an auxiliary thyristor having a shorted emitter structure on the cathode side thereof and wherein the cathode of the auxiliary thyristor is connected to the gate of the main thyristor to on-off control a large current by a small gate signal.

10 Claims, 7 Drawing Figures

GATE TURN-OFF AMPLIFIED THYRISTOR WITH NON-SHORTED AUXILIARY ANODE

This is a continuation of application Ser. No. 112,811 filed Jan. 17, 1980, abandoned.

The present invention relates to a gate turn-off thyristor, and more particularly to a gate turn-off thyristor suited to control an inductive load of high power.

A gate turn-off thyristor (hereinafter referred to as a GTO) can be turned from a conductive state into a non-conductive state by applying a gate signal of negative polarity between the gate and the cathode of the thyristor, and therefore can interrupt a large current without employing any commutating circuit. Accordingly, in recent years it has been earnestly demanded to develop a highly-advanced gate turn-off thyristor. In conventional gate turn-off thyristors, the semiconductor substrate has been usually doped with gold or the like serving as a lifetime killer in order to improve turn-off characteristics. However, when a large amount of gold is doped in the substrate, such characteristics as a turn-off gain and a turn-off time can be greatly improved, but the turn-on voltage becomes high and moreover the leakage current is increased at high temperatures so that the blocking characteristic is deteriorated. Thus, the conventional GTO's are not suited to control high power and cannot withstand a high applied voltage.

In recent years, there has been developed a GTO having a structure in which an emitter-base junction on the anode side is appropriately short-circuited to permit turn-off operation in several microseconds without its containing the above-mentioned gold. Thus, it becomes possible to provide a GTO with a small loss, which is widely used as a high-power chopper or inverter in various fields such as a control unit of a large-scale motor and power circuits.

FIG. 1 shows a cross section of a conventional GTO, in which the emitter-base junction on the anode side is short-circuited. Referring to FIG. 1, a silicon substrate 1 includes a $p_E$ layer, an $n_B$ layer, a $p_B$ layer and an $n_E$ layer, which are stacked to form a p-type emitter-base junction $J_1$, a central junction $J_2$ and an n-type emitter-base junction $J_3$. The p-type emitter-base junction $J_1$ is short-circuited at a plurality of positions by $n^+$ layers penetrating from the principal surface on the anode side into the $n_B$ layer. Further, it is a main feature of the above-mentioned GTO that the projection of the $n^+$ layers in the direction of the thickness thereof falls upon the n-type emitter-base junction $J_3$. The surfaces of the $p_E$ and $n^+$ layers, the surface of the $n_E$ layer, and the surface of the $p_B$ layer are kept in low-resistance contact with an anode electrode 2, a cathode electrode 3, and a gate electrode 4, respectively.

In the conductive state of the GTO, excess carriers which are accumulated in the $n_B$ layer, are swept out to the anode electrode 2 through the short-circuited portions of the p-type emitter-base junction $J_1$, namely, through the $n^+$ layers. That is, the GTO can produce the same effect in extinguishing carriers in the $n_B$ layer as the conventional GTO in which the silicon substrate is doped with gold, and therefore can exhibit an excellent turn-off characteristic. In order to produce such an effect, however, it is required to short-circuit the p-type emitter-base junction $J_1$ at a large number of positions. For example, the junction $J_1$ is so short-circuited as to have a short-circuit resistance of 0.2 to 0.5 Ω. As a result, a transistor formed of the $p_E$ layer, the $n_B$ layer and the $p_B$ layer provides low current amplification factor $\alpha$, which introduces such a problem as mentioned below when the GTO is put into the practical use. That is, in order to improve the turn-off characteristics of the GTO, it is required to short-circuit the p-type emitter-base junction $J_1$ in a high degree. In such a case, however, a gate current required to turn on the GTO is increased, and moreover a minimum load current (or a holding current $I_H$) for maintaining the conductive state is also increased.

FIG. 2 shows the relation between the holding current and the turn-off gain. As understood from FIG. 2, the turn-off characteristic and the conductive-state maintaining characteristic are contrary to each other.

A GTO which is large in both gate current $I_{GT}$ and holding current $I_H$, has a drawback that the GTO in the turn-on state is readily turned off when supplied for a short time with a current less than the holding current $I_H$, and is kept in the non-conductive state until the next gate signal is applied. Specifically, in the case where the above GTO is connected to such an inductive load as an induction motor, the phase difference between the voltage and current applied to the GTO is large and is varied in accordance with the state of the load. In order to prevent the GTO in the conductive state from being naturally turned off, a gate signal is applied which has a waveform such as a constant current superposed on the gate current $I_{GT}$.

FIG. 3 shows voltage and current waveforms of such a gate signal.

Referring to FIG. 3, the GTO is supplied with a gate current having a time duration of tens of microseconds when turned on, and is then supplied with a constant gate current of several amperes while the GTO is kept in the conductive state. In the period when the above constant gate current is supplied, the GTO is maintained in the conductive state even if the load current becomes less than the holding current $I_H$.

However, when such a gate signal as mentioned above is employed, there are produced such problems as power loss due to the gate signal being large and the gate circuit becomes expensive.

Accordingly, it is an object of the present invention to provide a GTO whose emitter-base junction on the anode side is short-circuited and which can be controlled by a low-power gate signal.

It is another object of the present invention to provide a GTO which is not turned off from the conductive to the non-conductive state even when supplied for a short time with a load current less than a predetermined holding current.

In order to attain these and other objects, a GTO according to the present invention is made up of a main thyrister whose emitter-base junction on the anode side is short-circuited and an auxiliary thyristor whose emitter-base junction on the cathode side is short-circuited, and the cathode of the auxiliary thyristor is connected to the gate of the main thyristor to form the so-called amplifying gate structure.

Now, explanation will be made on an embodiment of the present invention by reference to FIG. 4. In FIG. 4, like reference numerals designate members identical with or similar to those shown in FIG. 1.

Figure 1:
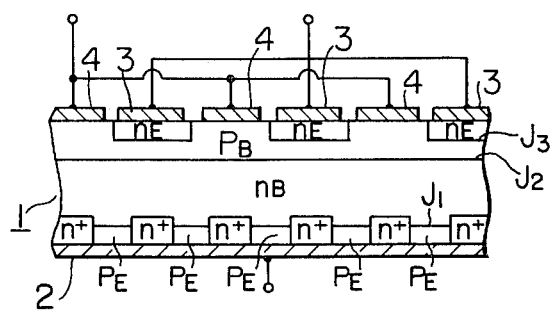
FIG. 1 is a longitudinal sectional view showing a part of a conventional GTO in which the emitter-base junction on the anode side is short-circuited.
Figure 2:
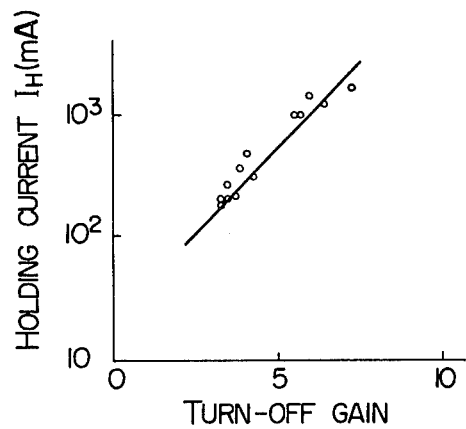
FIG. 2 is a graph showing the relation between the turn-off gain and the holding current of the conventional GTO shown in FIG. 1.
Figure 3:
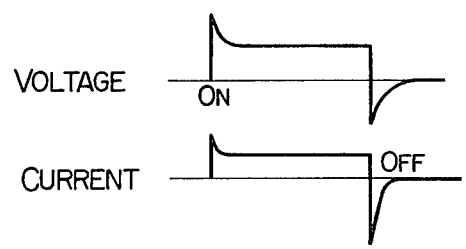
FIG. 3 shows waveforms of control voltage and current for turning on and off the GTO shown in FIG. 1.
Figure 4:
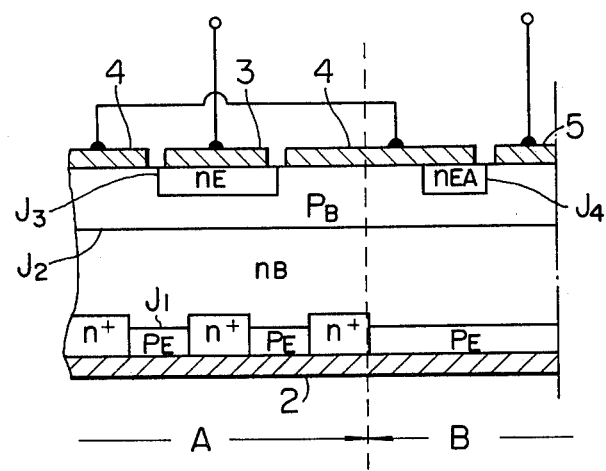
FIG. 4 is a fragmental sectional view showing an embodiment of a GTO according to the present invention, whose emitter-base junction on the anode side is short-circuited.

Referring to FIG. 4, a silicon substrate 1 is divided into A and B regions. In the A region is formed a GTO whose emitter-base junction on the anode side is short-circuited. That is, the above GTO has the same structure as that shown in FIG. 1. In more detail, a plurality of n+ layers, which form a part of an $n_B$ layer, penetrate a $p_E$ layer, and an anode electrode 2 is disposed in low-resistance contact with the surfaces of the n+ and $p_E$ layers. A plurality of $n_E$ layers are exposed to the surface on the cathode side of the substrate, and an n-type emitter-base junction $J_3$ is formed between each of the $n_E$ layers and a $p_B$ layer adjacent thereto. A gate electrode 4 is disposed in low-resistance contact with the surface of the $p_B$ layer in such an arrangement as facing each $n_E$ layer with a constant spacing therebetween. Further, a cathode electrode 3 is disposed in low-resistance contact with the surface of each $n_E$ layer. A plurality of cathode electrodes 3 are electrically connected to each other. The n-type emitter-base junction $J_3$ is exposed to the surface of the substrate between the gate electrode 4 and the cathode electrode 3, and therefore is short-circuited by the electrodes 3 and 4.

In the B region is formed an auxiliary n-type emitter layer $n_{EA}$ which is adjacent to the $p_B$ layer. A fourth junction $J_4$, which is another n-type emitter-base junction, is formed between the $n_{EA}$ and $p_B$ layers. A gate electrode 4 is disposed in low-resistance contact with the surfaces of the $n_{EA}$ and $p_B$ layers. Further, a control electrode 5 is disposed in low-resistance contact with the surface of the $p_B$ layer in such an arrangement as to be facing the n-type emitter-base junction $J_4$. In the B region, the $p_E$ layer is not short-circuited in at least that portion of the $p_E$ layer on which the projection of the junction $J_4$ in the direction of the thickness thereof falls. In other words, in the B region, the fourth junction $J_4$ is short-circuited by the gate electrode 4 but the p-type emitter-base junction $J_1$ has no short-circuited portion.

Figure 5:
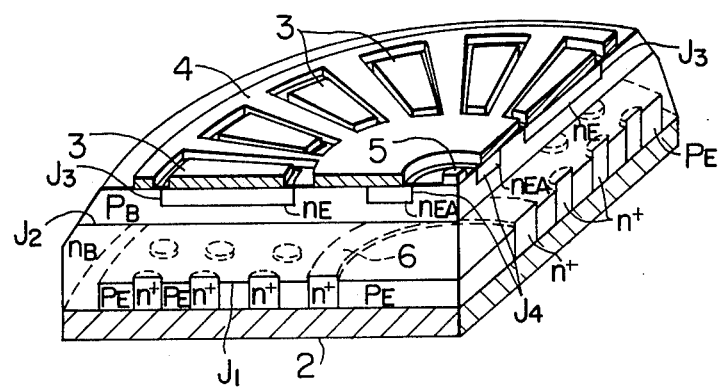
FIG. 5 is a perspective, sectional view showing a detailed structure of another embodiment of a GTO according to the present invention, in which the emitter-base junction on the anode side is short-circuited.

FIG. 5 shows the detailed structure of another embodiment of the present invention. Now, dimensions and a fabricating method of the embodiment shown in FIG. 5 will be explained below in detail.

Referring to FIG. 5, a silicon wafer having an n-type conductivity and a resistivity of 30 to 40 Ω is used as a semiconductor substrate. A plurality of n+ layers each having a depth of about 60 μm are formed on the anode side of the substrate through selective diffusion of phosphorous. In the above diffusion process, an $SiO_2$ film is used as a mask. The n+ layers have a diameter of 0.07 mm, and are arranged at intervals of 0.3 mm. At this time, a ring-shaped n+ layer 6 having a width of 0.1 mm is also formed in such a manner as encircling the outside of a B region having a radius of about 2.5 mm. Next, gallium is diffused into one and the other surfaces of the substrate to form p-type layers having a depth of about 55 μm. At this time, on the anode side, $p_E$ layers are formed in surface portions other than those subjected to diffusion of phosphorous. Then, selective diffusion of phosphorous is again conducted on the cathode side to form n-type layers having a depth of about 25 μm in the $p_B$ layer in the following manner. That is, a plurality of belt-shaped $n_E$ layers each having a width of about 200 μm are arranged in an A region, and a ring-shaped $n_{EA}$ layer having an inner diameter of 1.0 mm and an outer diameter of 1.5 mm is formed in the B region. Subsequently, the anode side of the substrate is alloyed to a 2.5 mm thick supporting plate made of tungsten through aluminium serving as a solder. The cathode side is coated with an evaporated aluminum film, and then is subjected to sintering. Subsequently, the sintered aluminium film is etched so as to form cathode electrodes 3, a gate electrode 4 and a control electrode 5 which have predetermined shapes.

Next, explanation will be made on the advantages of the present invention.

The reduction of gate current is first discussed. A GTO according to the present invention has the so-called gate amplifying structure. That is an auxiliary thyristor in a B region is first turned on by a control signal from the control electrode 5. Subsequently, a load current flowing through the auxiliary thyristor is led through the gate electrode 4 to a main thyristor in an A region to form a triggering current for turning on the main thyristor. As is apparent from the above, only the auxiliary thyristor in the B region is triggered by the control signal. Therefore, the control signal required to fire the GTO, that is, the so-called gate current $I_{GT}$ is decreased to a large degree. For example, the conventional GTO shown in FIG. 1 necessitated a gate current of 1 A, but the gate current of the GTO shown in FIG. 5 was 0.1 A.

As has been described previously, in order to prevent a GTO from being naturally turned off, it is required to supply the GTO with a constant gate current while the GTO is kept in the conductive state. However, in a GTO according to the present invention, the main thyristor in the A region is prevented from being naturally turned off, so long as the auxiliary thyristor in the B region is kept in the conductive state. Accordingly, the intensity of the constant gate current can be reduced, and the gate power consumed by the gate current can be decreased to one hundredth of that of the conventional GTO.

Next, explanation will be made on the improvement of firing characteristic by the present invention.

In the auxiliary thyristor formed in the B region, the emitter-base junction on the anode side is not short-circuited. Accordingly, a transistor which is made up of $p_E$, $n_B$ and $p_B$ layers in the B region, is large in current amplification factor $\alpha_{pnp}$, and therefore the auxiliary thyristor is readily fired by a small gate current $I_{GT}$.

Further, explanation will be made on the prevention of malfunction which may take place in turning off a GTO.

In order to remarkably improve the firing characteristic of a GTO, it is required that the width of the emitter-base junction $J_4$ is made large and thereby the junction $J_4$ is slightly short-circuited by the gate electrode 4. However, the short-circuit of the junction $J_4$ by the gate electrode 4 cannot be made too small for the following reasons. That is, the above structure makes large the short-circuit resistance between the control electrode 5 and the gate electrode 4 bypassing the junction $J_4$. As a result, when the GTO is turned off, a gate current for turning off the GTO flows through the $p_B$ layer, and thus a large voltage drop is generated in the $p_B$ layer. Since the above voltage drop is proportional to the gate current $I_{GT}$ and is varied in accordance with the turn-off condition, in some cases, a gate voltage, which is greater than a breakdown voltage between the cathode electrode 3 and the gate electrode 4 in the A region, is applied to the GTO, and thus the GTO is broken. Further, in the case where the n-type emitter-base junction $J_4$ is slightly short-circuited, if small forward noise is applied between the control electrode 5 and the cathode electrode 3 immediately after the GTO has been turned off, the above GTO is again turned on and therefore fails to be turned off.

For the above reasons, it is preferable to short-circuit the junction $J_4$ of the auxiliary thyristor to a greater degree. In such a case, the construction according to the present invention in which the p-type emitter-base junction in the B region is not short-circuited, is effective in reducing the gate current $I_{GT}$ and the holding current $I_H$ of the auxiliary thyristor. The inventors have found through experiments that a short-circuit resistance of 0.1 to 0.5 $\Omega$ in the junction $J_4$ was preferred. In such a case, a GTO of a rated current of 100 A required only a current of 0.1 to 0.2 A as the constant gate current, and moreover no malfunction took place when the GTO was turned off. On the other hand, a conventional GTO of the same rated current required a current of 2 A as the constant gate current.

Figure 6:
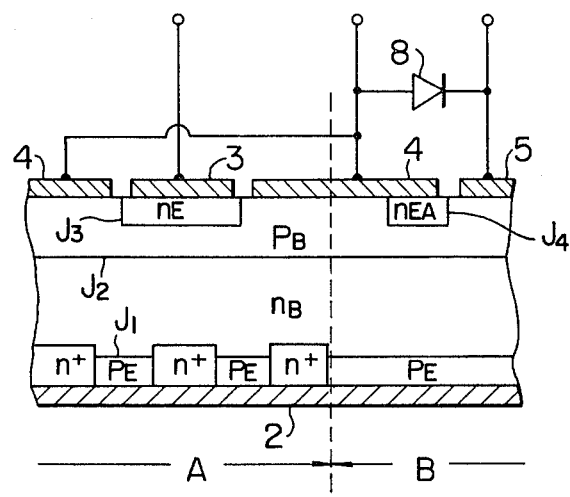
FIG. 6 is a fragmental sectional view showing a further embodiment of a GTO according to the present invention.

FIG. 6 shows a further embodiment of a GTO according to the present invention. In FIG. 6, like reference numerals designate members identical with or similar to those shown in FIGS. 4 and 5.

The embodiment shown in FIG. 6 includes a diode 8 between a gate electrode 4 and a control electrode 5. Owing to the presence of the diode 8, the greater part of the gate current for turning off the embodiment (or GTO) passes through the diode 8, and only a little part thereof flows through the semiconductor substrate, namely, the $p_B$ layer of the substrate. Accordingly, the voltage drop in the $p_B$ layer can be reduced to the level of the forward voltage drop of the diode 8. Thus, it becomes possible to solve the problem which has been previously described in connection with the prevention of malfunction in turning off a GTO.

In the foregoing embodiments, there has been shown a GTO having a four-layer structure of p-n-p-n in which a p-type layer, an n-type layer, a p-type layer and an n-type layer are stacked in the order described from the anode side to the cathode side. However, a GTO according to the present invention which includes another four-layer structure of n-p-n-p, can produce the same effect as the above embodiments.

In the embodiment shown in FIG. 5, the $n^+$ layers are formed on the anode side. It should be noted that the arrangement of $n^+$ layer is not limited to such a structure but can take various patterns for the convenience of fabrication.

Figure 7:
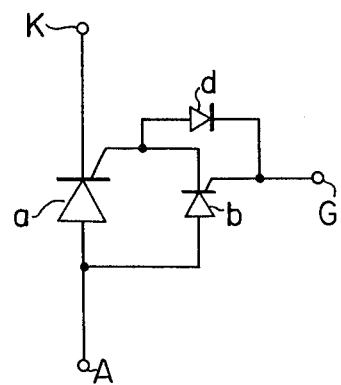
FIG. 7 is an equivalent circuit showing a still further embodiment of a GTO according to the present invention.

Further, various methods may be used to connect the main thyristor to the auxiliary thyristor. For example, as shown in FIG. 7, the main thyristor a and the auxiliary thyristor b may be formed in different semiconductor substrates, and the substrates may be included in one or different packages. In this case, the main thyristor a has such a structure as the emitter-base junction on the anode side is short-circuited, while the auxiliary thyristor b has such a structurre as the emitter-base junction on the anode side is never short-circuited. A diode d corresponds to the diode 8 shown in FIG. 6. The anode electrode of the main thyristor a and that of the auxiliary thyristor b are connected to an anode terminal A of a GTO which is made up of the main and auxiliary thyristors. The cathode electrode of the main thyristor a is connected to a cathode terminal K of the GTO, the cathode electrode of the auxiliary thyristor b is connected to the gate electrode of the main thyristor a, and the gate electrode of the auxiliary thyristor b is connected to a gate terminal G of the GTO. Further, the diode d is connected between the gate electrodes of the main and auxiliary thyristors a and b. The GTO thus connected and shown in FIG. 7 can perform the same operation as the GTO shown in FIG. 6.

As has been described hereinbefore, according to the present invention, there is provided a GTO which can maintain the conductive state by a small gate current and is small in control power. Specifically, the p-type emitter-base junction of the main thyristor can be short-circuited to a large degree by including in the silicon substrate the auxiliary thyristor which is small in gate current $I_{GT}$, and therefore it is possible to obtain a GTO having an excellent turn-off characteristic.

What we claim is:

1. A gate turn-off thyristor comprising:
   a semiconductor substrate including a first semiconductor layer of a first conductivity type, a second semiconductor layer of a second conductivity type, a third semiconductor layer of said first conductivity type and a fourth semiconductor layer of said second conductivity type, said first, second, third and fourth layers being stacked in the order described to form a laminate, a fifth semiconductor layer of said second conductivity type being adjacent to said third semiconductor layer and being spaced apart from said fourth semiconductor layer, said first, second, third and fourth semiconductor layers making up a main thyristor, said first, second, third and fifth semiconductor layers making up an auxiliary thyristor;
   a first main electrode disposed in low-resistance contact with said first semiconductor layer and said second semiconductor layer in the main thyristor portion of said semiconductor substrate, and disposed in low-resistance contact with only said first semiconductor layer in the auxiliary thyristor portion of said semiconductor substrate, so that said first and second semiconductor layers in said main thyristor portion are short-circuited by said first main electrode while said first and second semiconductor layers in said auxiliary thyristor portion are unshorted by said first main electrode;
   a second main electrode disposed in low-resistance contact with said fourth semiconductor layer;
   a control electrode disposed in low-resistance contact with said third semiconductor layer; and
   an auxiliary electrode disposed in low-resistance contact with said third and fifth semiconductor layers.

2. A gate turn-off thyristor according to claim 1, wherein said first semiconductor layer is exposed to a first principal surface of said semiconductor substrate and said third, fourth and fifth semiconductor layers are exposed to a second principal surface of said semiconductor substrate.

3. A gate turn-off thyristor according to claim 2, wherein said fourth semiconductor layer is divided into a plurality of regions.

4. A gate turn-off thyristor according to claim 3, wherein said first and second semiconductor layers are short-circuited by said first main electrode, which is kept in low-resistance contact with said first and second semiconductor layers, in that portion of said first principal surface which receives an orthogonal projection of each region of said fourth semiconductor layer to said first principal surface.

5. A gate turn-off thyristor according to claim 1, wherein said first conductivity type is a p-type conductivity and said second conductivity type is an n-type conductivity.

6. A gate turn-off thyristor according to claim 1, wherein said first conductivity type is an n-type conductivity and said second conductivity type is a p-type conductivity.

7. A gate turn-off thyristor according to claim 1, wherein a short-circuit resistance formed between said third and fifth semiconductor layers by said auxiliary electrode lies within a range of 0.1 to 0.5 $\Omega$.

8. A gate turn-off thyristor according to claim 1, wherein a diode is connected between said control electrode and said auxiliary electrode in such a manner that the forward current of said diode flows from said auxiliary electrode toward said control electrode through said diode.

9. A gate turn-off thyristor comprising:
 a first semiconductor substrate including a first semiconductor layer of a first conductivity type, a second semiconductor layer of a second conductivity type, a third semiconductor layer of said first conductivity type and a fourth semiconductor layer of said second conductivity type, said first, second, third and fourth semiconductor layers being stacked in the order described to form a plurality of pn junctions therebetween, said first and second semiconductor layers being electrically short-circuited in at least one portion of one principal surface of said first semiconductor substrate;
 a second semiconductor substrate including another first semiconductor layer of said first conductivity type, another second semiconductor layer of said second conductivity type, another third semiconductor layer of said first conductivity type and another fourth semiconductor layer of said second conductivity type, another first, second, third and fourth semiconductor layers being stacked in the order described to form a plurality of pn junctions therebetween, said first semiconductor layer being electrically unshorted to said second semiconductor region in said second semiconductor substrate;
 first connecting means for electrically connecting said first semiconductor layer of said first semiconductor substrate to said first semiconductor layer of said second semiconductor substrate;
 second connecting means for electrically connecting said third semiconductor layer of said first semiconductor substrate to said fourth semiconductor layer of said second semiconductor substrate;
 a first main terminal connected to said first connecting means;
 a second main terminal connected to said fourth semiconductor layer of said first semiconductor substrate; and
 a control terminal connected to said third semiconductor layer of said second semiconductor substrate.

10. A gate turn-off thyristor according to claim 9, wherein a diode is connected between said second connecting means and said control terminal in such a manner that the forward current of said diode flows from said second connecting means toward said control terminal through said diode.

* * * * *